(12) United States Patent
Fredrickson

(10) Patent No.: US 6,681,352 B1
(45) Date of Patent: Jan. 20, 2004

(54) METHOD FOR TESTING DAMAGED INTEGRATED CIRCUITS

(75) Inventor: Toby Alan Fredrickson, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 621 days.

(21) Appl. No.: 09/610,669

(22) Filed: Jul. 5, 2000

(51) Int. Cl.$^7$ .................. G01R 31/28; B23K 37/00
(52) U.S. Cl. ............. 714/724; 361/212; 361/220; 324/158.1; 228/4.5; 228/13
(58) Field of Search .............. 714/724; 361/212, 361/220; 228/13, 4.5, 119; 324/158.1, 754, 765

(56) References Cited

U.S. PATENT DOCUMENTS 5,029,747 A * 7/1991 Russo et al. ............... 228/4.5
5,910,878 A * 6/1999 Mello et al. ............... 361/212

* cited by examiner

Primary Examiner—Emmanuel L. Moise
(74) Attorney, Agent, or Firm—Patrick T. Beyer; Edel M. Young; Justin Liu

(57) ABSTRACT

A method for testing packaged integrated circuits (ICs) having bent or broken leads. A lower portion of each lead is cut to leave a stub located close to the package body of the damaged IC. The damaged IC is then mounted onto a probe card having upward-facing probes that contact the lead stubs. Test signals are then transmitted between an IC tester and the damaged IC through the probe card.

3 Claims, 1 Drawing Sheet

FIG. 4

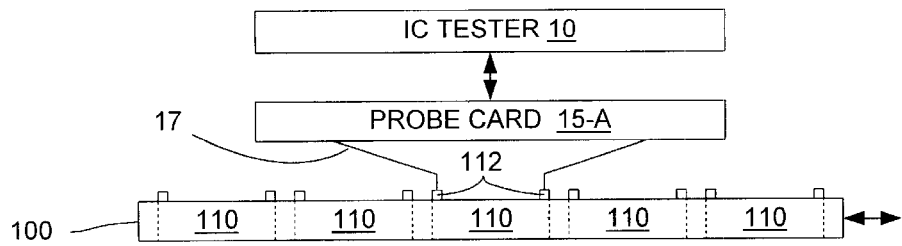
FIG. 1 (PRIOR ART)
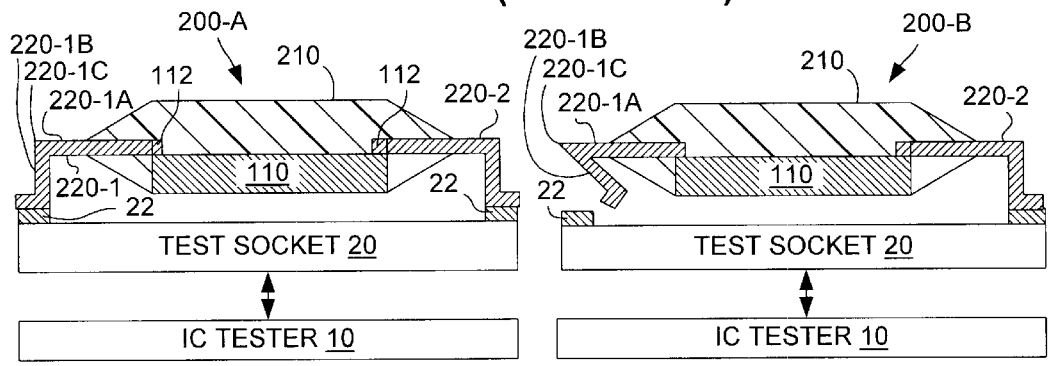
FIG. 2(A) (PRIOR ART)  FIG. 2(B) (PRIOR ART)
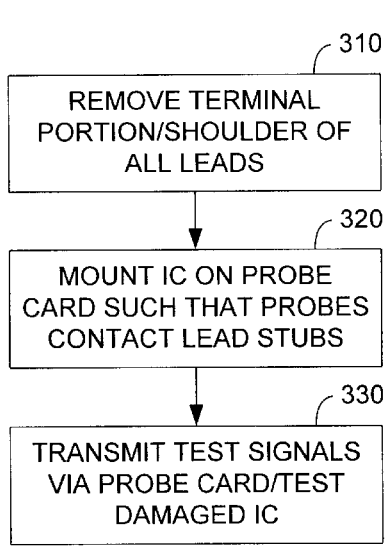
FIG. 3
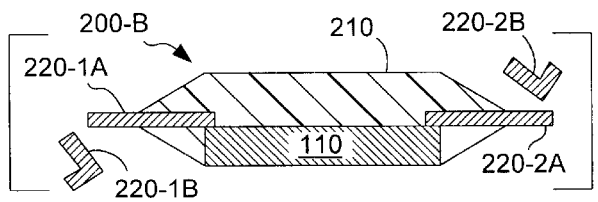
FIG. 4
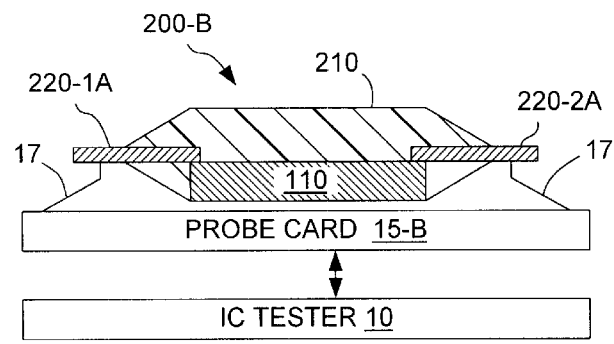
FIG. 5

METHOD FOR TESTING DAMAGED INTEGRATED CIRCUITS

FIELD OF THE INVENTION

The present invention relates to methods for testing integrated circuits, and more particularly to methods for testing packaged integrated circuits that have damaged or bent leads.

RELATED ART

Integrated circuits (ICs) are typically tested during several stages of their lifetime. Testing is typically carried out by automatic test equipment (ATE) that includes an IC test signal generator (IC tester) and an interface tool (e.g., a probe card or a test socket). The interface tool is used to provide electrical connections to pads or leads of a device-under-test (DUT), and to route test signals between the DUT and the IC tester. This testing process is typically used to identify non-functional ICs, and is sometimes used to determine why the IC is nonfunctional.

FIG. 1 depicts an ATE arrangement that is utilized during wafer testing procedures performed before a wafer 100 is diced to form individual dies (IC chips) 110. Each die 110 includes circuitry (not shown) formed on the wafer material that is connected to pads 112 exposed on an upper surface of wafer 100. An IC tester 10 is used to apply test signals to pads 112 of each die 110 via a probe card 15-A that includes metal (e.g., tungsten) probes 17. Typically, wafer 100 is mounted on an X-Y table (not shown) that positions a selected die 110 under probe card 15-A. Metal probes 17 are then brought into contact with pads 112. Test signals are then transmitted between IC 110 and IC tester 10 via probe card 15-A. This wafer testing procedure identifies non-functional die on wafer 100, which are typically marked using ink or are otherwise identified (e.g., using wafer mapping).

After wafer testing is completed, wafer 100 is then cut (diced) to separate die 110 from each other. The nonfunctional die identified during wafer testing are discarded, and the good (functional) die are sent to a assembly facility for placement into various types of IC packages. The packaged ICs are then returned to the IC tester for operational verification.

FIG. 2(A) depicts an ATE arrangement that is utilized to test a packaged IC 200-A. As indicated, packaging involves housing each die 110 in a package body 210 (e.g., plastic) along with a series of metal leads 220 that contact pads 112 and extend from package body 210. The package type illustrated in FIG. 2(A) is a dual-in line package (DIP) in which leads 220-1 and 220-2 extend from opposite sides of package body 210 and are bent downward. For example, lead 220-1 includes a stub portion 220-1A extending from package body 210, and a terminal (arm) portion 220-1B extending downward from a shoulder (bend) 220-1C. During IC testing, arm portions 220-1B are inserted into a test socket 20 that includes a series of contacts 22 for passing test signals between die 110 and IC tester 10. After testing, good packaged ICs 200-A are sold to customers, and non-functional ICs are discarded.

ICs occasionally fail after passing all of the tests described above and are sold to customers. These failing parts are sometimes removed from the customer's application and returned to the manufacturer so that the cause of failure can be determined. Unfortunately, many customers lack proper IC removal equipment and procedures, and the returned ICs often include bent or broken leads.

FIG. 2(B) shows a damaged IC 200-B in which lead 220-1B is bent inward at shoulder 220-1C such that arm 220-1B fails to align with the underlying contact 22 of test socket 20. In order to use test socket 20 to determine the cause of failure of damaged IC 200-B, it is necessary to manually bend arm 220-1B back into its original position. However, this repair process is very time consuming, and may not be possible if arm 220-1B breaks during the bending process. Therefore, the conventional process of testing damaged ICs using test socket 20 is very time consuming, and is sometimes impossible.

What is needed is a method for testing damaged ICs that avoids the problems associated with the prior art.

SUMMARY

The present invention is directed to a method for testing packaged integrated circuits (ICs), and in particular to packaged ICs having damaged (e.g., bent) leads. According to the present invention, instead of attempting to re-bend or otherwise fix the damaged leads, a lower portion of each lead (whether damaged or not) is cut off such that only a stub of lead material is left that is located close to the package body of the IC. The IC is then mounted onto a probe card having upward-facing probes that contact the lead stubs. Test signals are then transmitted between an IC tester and the damaged IC through the probe card. By cutting (removing) the lower portion of each of the leads, a substantial amount of time is saved over prior art methods that require re-bending or otherwise repairing the leads so that the damaged IC can be tested using a test socket.

The present invention will be more fully understood in view of the following description and drawings.

BRIEF DESCRIPTION OF THE DRAWINGS

FIG. 1 is a side view showing a conventional wafer testing apparatus;

FIG. 2(A) is a side view showing an apparatus for testing a non-damaged packaged IC;

FIG. 2(B) is a side view showing a damaged IC with bent package leads;

FIG. 3 is a flow diagram showing a method for testing damaged ICs according to the present invention;

FIG. 4 is a side view depicting the removal of a portion of the leads from a damaged IC; and FIG. 5 is a side view showing an IC testing apparatus for testing damaged ICs according to the present invention.

DETAILED DESCRIPTION

The present invention is directed to a method for testing damaged ICs, such as IC 200-B (see FIG. 2(B)), that are packaged using dual-in line packaging (DIP) techniques, or using similar package types in which leads extend from a peripheral edge of a package body and are bent downward. The term "damaged IC" is used herein to describe a packaged IC having missing, bent, broken, or otherwise disfigured leads (e.g., solder bridged between adjacent leads) that cannot be inserted into a standard test socket.

FIG. 3 is a flow diagram showing a method for testing damaged ICs according to an embodiment of the present invention.

First, a terminal (end) portion of each of the plurality of leads is removed from a damaged IC such that a only a short stub portion protrudes from the package body (step 310). As shown in FIG. 4, according to one embodiment, removal of the terminal portions of each lead from damaged IC 220(B) involves cutting each of the leads at the shoulder (e.g., shoulder 220-1C) to separate the arm portion (e.g., arm portion 220-1B) from its associated stub portion (e.g., stub portion 220-1A). Note that this cutting process is performed on all of the leads, whether damaged or not, so that a uniform series of stub portions 200-2A and 200-2B are exposed along the edges of damaged IC 200-B.

Returning to FIG. 3, the damaged IC is then contacted by a probe card such that each probe of the probe card contacts a corresponding lead stub (step 320). A suitable platform may be used to support the damaged IC for contact by the probe card. As described above, probe cards are typically utilized during wafer testing procedures, and include wire probes that can be arranged in a pattern that corresponds with the stubs of the damaged IC. The present invention utilizes probe cards to avoid the problems associated with prior art damaged IC testing methods (i.e., repairing bent or damaged leads so that they can be inserted into a test socket). Further, probe cards are substantially less expensive than test sockets (similar to conventional test socket 20, described above) modified to contact stub portions 200-1A and 200-2A (approximately $3,000 versus $10,000 to $100,000). Moreover, probe cards require a smaller target, and the tungsten-tipped probes of the probe cards reliably penetrate through surface contaminants to provide suitable contact to the stub portions of a damaged IC.

FIG. 5 is a side view showing a test apparatus according to an embodiment of the present invention. Note that probe card 15-B is amounted such that probes 17 face upward, thereby allowing damaged IC 200-B to be mounted onto the tips of probes 17. A suitable platform structure (not shown) may be used to hold damaged IC 200-B during testing.

Returning to FIG. 3, after damaged IC 200-B is contacted by probe card. 15, test signals are transmitted between IC tester 10 and damaged IC 220-B through the probe card 15, thereby allowing the non-functioning die 110 to be interrogated and the cause of failure to be determined.

As suggested above, in addition to the specific embodiments disclosed herein, other modifications to the test methods of the present invention are also possible that fall within the spirit and scope of the present invention. For example, the test methods described above may be modified as necessary to support other IC package types, such as SOIC and QFP packaged ICs. Therefore, the invention is limited only by the following claims.

What is claimed is:

1. A method for testing a damaged packaged integrated circuit (IC), the damaged IC including a die housed within a package body, and a plurality of metal leads protruding from the package body that are electrically connected to the die, the method comprising:

removing a terminal portion of each of the plurality of leads such that only a stub portion remains connected to and protrudes from the package body;

contacting the damaged IC using a probe card such that the stub portion of each of the plurality of leads is contacted by an associated probe of the probe card; and transmitting test signals between an IC tester and the damaged IC through the probe card.

2. The method according to claim 1, wherein each of the plurality of metal leads includes said stub portion and an arm portion separated from said stub portion by a shoulder, wherein removing each of the plurality of leads comprises cutting the arm portion of each lead at the shoulder.

3. The method according to claim 2, wherein contacting the damaged IC comprises arranging the probe card such that the probes extend upward from the probe card, and mounting the damaged IC onto the upward-facing probes.

* * * * *